(12) United States Patent
Li

(10) Patent No.: US 11,126,289 B2
(45) Date of Patent: Sep. 21, 2021

(54) DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Bo Li, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 476 days.

(21) Appl. No.: 16/310,456

(22) PCT Filed: Sep. 11, 2018

(86) PCT No.: PCT/CN2018/104981
§ 371 (c)(1),
(2) Date: Dec. 17, 2018

(87) PCT Pub. No.: WO2020/024370
PCT Pub. Date: Feb. 6, 2020

(65) Prior Publication Data
US 2021/0223894 A1    Jul. 22, 2021

(30) Foreign Application Priority Data
Aug. 1, 2018 (CN) .......................... 201810862469.4

(51) Int. Cl.
*G06F 3/041* (2006.01)
*G09G 3/3225* (2016.01)
(Continued)

(52) U.S. Cl.
CPC ......... *G06F 3/0412* (2013.01); *G09G 3/3225* (2013.01); *G06F 2203/04102* (2013.01);
(Continued)

(58) Field of Classification Search
CPC ........ G06F 3/0412; G06F 2203/04102; G09G 3/3225; H01L 2251/5338; H01L 51/5281; H01L 27/3244
See application file for complete search history.

(56) References Cited

U.S. PATENT DOCUMENTS 9,823,699 B2 * 11/2017 Ko .......................... G06F 1/1652
10,212,811 B1 * 2/2019 Zhang ................. H01L 27/3244
(Continued)

FOREIGN PATENT DOCUMENTS

| CN | 103985321 A | 8/2014 |
| CN | 104752622 A | 7/2015 |

(Continued)

*Primary Examiner* — David D Davis
(74) *Attorney, Agent, or Firm* — Soroker Agmon Nordman

(57) ABSTRACT

The present disclosure provides a display device, including elastic support columns formed on a foldable region of a touch control sensing layer and an adhesive filled around the elastic support columns; the height of the elastic support columns varies with the magnitude of the stress, and the thickness of the adhesive is controlled by adjusting the height and the density of the elastic support columns to ensure the best folding results. It is possible to maintain the product appearance without apparent changes before and after folding to avoid the adhesive deformation which is not recoverable due to the much thick adhesive and a repeated folding, and realize a flexible foldable touch control display.

11 Claims, 3 Drawing Sheets

(51) Int. Cl.
   *H01L 27/32*        (2006.01)
   *H01L 51/52*        (2006.01)
(52) U.S. Cl.
   CPC ...... *H01L 27/3244* (2013.01); *H01L 51/5281*
              (2013.01); *H01L 2251/5338* (2013.01)

(56) References Cited

U.S. PATENT DOCUMENTS

| | | | | |
|---|---|---|---|---|
| 10,347,852 | B2* | 7/2019 | Myeong | G06F 1/1652 |
| 2012/0307423 | A1* | 12/2012 | Bohn | G06F 1/1652 |
| | | | | 361/679.01 |
| 2015/0325804 | A1* | 11/2015 | Lindblad | G06F 3/0362 |
| | | | | 313/511 |
| 2016/0070304 | A1* | 3/2016 | Shin | G06F 1/1652 |
| | | | | 361/679.26 |
| 2017/0060311 | A1 | 3/2017 | Hsu | |
| 2018/0097197 | A1 | 4/2018 | Han et al. | |
| 2019/0148679 | A1 | 5/2019 | Li | |

FOREIGN PATENT DOCUMENTS

| | | | | | |
|---|---|---|---|---|---|
| CN | 107230429 | A | * | 10/2017 | |
| CN | 107610598 | A | | 1/2018 | |
| CN | 107611161 | A | * | 1/2018 | ........... G06F 1/1652 |
| EP | 2993870 | A1 | * | 3/2016 | ....... G02F 1/133308 |
| EP | 3301506 | A1 | | 4/2018 | |
| TW | M512747 | U | | 11/2015 | |

\* cited by examiner

DISPLAY DEVICE

FIELD OF INVENTION

The present invention relates to a flexible display technology, and more particularly to a flexible and foldable touch control display device.

BACKGROUND OF INVENTION

In recent years, rapid development of organic light emitting diode (OLED) display technology has promoted rapid entry of curved surfaces and flexible touch display products into the market, and the technical update in related fields is also changing with each passing day. OLED refers to a diode that emits light by carrier injection and recombination under an electric field driven by an organic semiconductor material and a luminescent material.

For design of current fixed-curvature products, a bending radius is large and shape is fixed, so that the technical difficulty is relatively low, and thus it is easiest to implement. However, for foldable products, because the products need to undergo long-term repeated folding, it is necessary to carry out comprehensive technical improvements on electrical performance, mechanical performance, optics, mechanics aspects, and the like. At this stage, the different layers of the touch display module are fixed by an optically clear adhesive (OCA), and the OCA is a kind of adhesive material that is easy to deform. When the product changes from a flat state to a folded state, the OCA is squeezed and deformed. When the product is expanded from the folded state to a flat state, the OCA will change from the original squeezed state to a stretched state, but the OCA will not be restored in real time. Currently, the general OCA takes at least a few hours to roughly recover to an original state before folding.

Refer to FIGS. 1-3, wherein FIG. 1 shows an expanding state of a foldable touch control display device, FIG. 2 shows a folded state of the foldable touch control display device, and FIG. 3 shows a plan view of a current foldable touch control display device. Here, the area where the folding causes deformation and stress concentration is referred to as a bending affected area (as indicated by reference numeral 31 in FIG. 3, wherein the reference numerals 311 and 312 are the two boundaries of the bending affected area, and the reference numeral 100 is the folding central axis). In theory, since the product is folded in half, the area affected by the folding should be a very thin line. However, since there are many layers in a touch control display module, the area affected by the folding will actually reach several millimeters. Moreover, the thicker the OCA thickness, the slower the recovery of the deformation. Therefore, to achieve a foldable touch control display technology, the improvement of the OCA is required as soon as possible. At present, the main solution is to reduce the thickness of OCA as much as possible. The reduction of OCA thickness can improve the crease of the folded area, but there is also a problem that the OCA cannot effectively fill a gap difference between different layers, and cannot maintain a good and effective viscosity. In addition, there is also a risk of bubble generation.

Therefore, avoiding the OCA deformation of the foldable touch control display device, which is difficult to be restored, due to repeated folding to realize a flexible foldable touch control display has become an urgent technical problem to be solved.

SUMMARY OF INVENTION

An object of the present invention is to provide a display device, which can avoid an optically clear adhesive (OCA) deformation of a foldable touch control display device due to repeated folding and the OCA deformation is not recoverable, and realize a flexible foldable touch control display.

To achieve above object, the present invention provides a display device, comprising a display panel, wherein a touch control sensing layer and a flexible cover are disposed in sequence on the display panel; wherein the touch control sensing layer has a foldable region provided with supporting pillar structures; the supporting pillar structures comprises elastic support columns distributed on the foldable region, and an adhesive filled around the elastic support columns; the elastic support columns are made of an organic transparent material, and uniformly distributed on the foldable region; and each of the elastic support columns has a height less than or equal to a filling thickness of the adhesive, and the height of each of the elastic support columns is gradually reduced from a central area of the foldable region toward two sides of the foldable region.

To achieve above objects, the present invention further provides a display device, comprising a display panel, wherein a touch control sensing layer and a flexible cover are disposed in sequence on the display panel; wherein the touch control sensing layer has a foldable region provided with ltd supporting pillar structures; the supporting pillar structures comprises elastic support columns distributed on the foldable region, and an adhesive filled around the elastic support columns; and each of the elastic support columns has a height less than or equal to a filling thickness of the adhesive, and the height of each of the elastic support columns varies with the magnitude of the stress within the foldable region when the display device is folded.

The advantages of the present invention are that the display device in the present invention uses elastic support columns formed on a foldable region of a touch control sensing layer, and an adhesive filled around the elastic support columns, wherein the height of each of the elastic support columns varies with the magnitude of the stress within the foldable region when the display device is folded, and a thickness of the adhesive can be controlled by adjusting the height and the density of the elastic support column, to ensure the best folding results. In this way, the product can maintain its appearance without apparent changes before and after folding during the whole procedure from the flat state to the folded state further to the expanding state due to the support function of the elastic support column and the firm adhesion of the adhesive, thereby avoiding the adhesive deformation which is not recoverable due to the much thick adhesive and a repeated folding, and realize a flexible foldable touch control display. In addition, the supporting pillar structures can be disposed between different layers of the display device to adhere the different layers to each other.

BRIEF DESCRIPTION OF DRAWINGS

In order to more clearly illustrate the technical solutions in the embodiment of the present invention, the following drawings, which are intended to be used in the description of the embodiment or of the present invention, will be briefly described. It is understood that the drawings described below are merely some embodiments of the present invention, and it will be possible to those skilled in the art to obtain other drawings according to these drawings without creative efforts.

DETAILED DESCRIPT ION OF PREFERRED EMBODIMENTS

Figure 1:
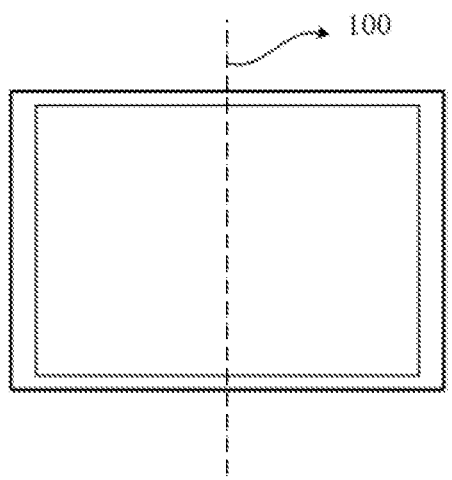
FIG. 1 shows a foldable touch control display device in an expanding state.
Figure 2:
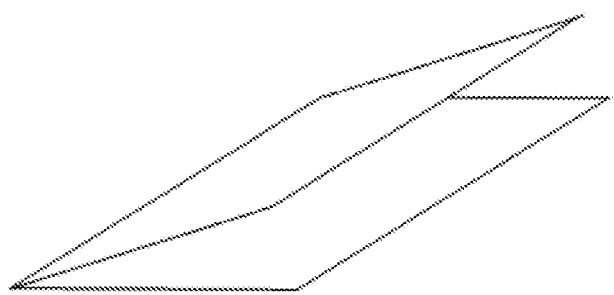
FIG. 2 shows a foldable touch control display device in a folded state.
Figure 3:
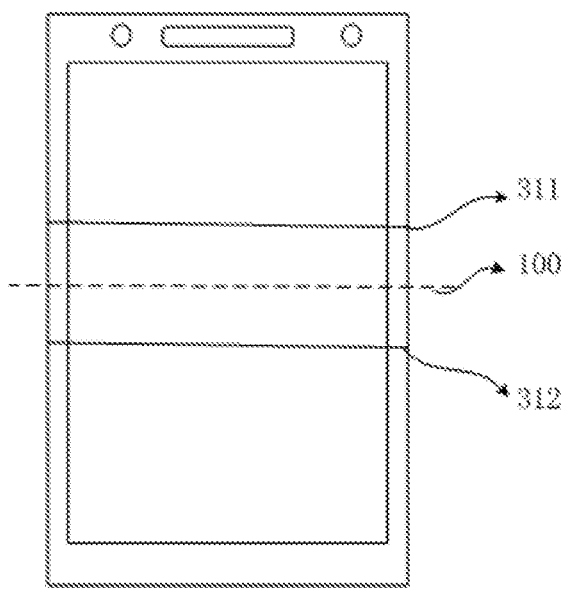
FIG. 3 is a schematic plan view of a current foldable touch control display device.

The detailed description of the following embodiments is used for exemplifying the specific embodiments of the present invention by referring to the accompany drawings. The same or similar reference numerals indicate the same or similar elements or elements having the same or similar functions. The embodiments described below with reference to the drawings are intended to be exemplary for merely illustrating the present invention and are not to be construed as limiting to the present invention.

In the present invention, unless specifically defined or limited to, a first feature "on" or "below" a second feature may include direct contact of the first and the second feature, and may also mean that the first and the second feature does not directly contact but through additional features between them. Moreover, the first feature "on", "above", and "upon" the second feature means that the first feature directly above or obliquely above the second feature, or merely indicates a first feature level higher than a second feature level. A first feature "below", "under" and "beneath" the second feature means that the first feature directly below or obliquely below the second feature, or merely indicates a first feature level lower than a second feature level.

The following disclosure provides various embodiments or examples for implementing various structures of the present invention. To simplify the disclosure of the present invention, the components and arrangements of the specific examples are described below. Of course, they are merely examples and are not intended to limit the invention. In addition, the present invention may be repeated with reference to the numerals and/or letters in various examples, and these repeats are for simplifying and clarifying. The repeats themselves do not indicate the relationship between the various implementations and/or arrangements. Moreover, the present invention provides various examples of specific process and materials, but one of ordinary skill in the art will recognize the applications of other process and/or the use of other materials.

Figure 4:
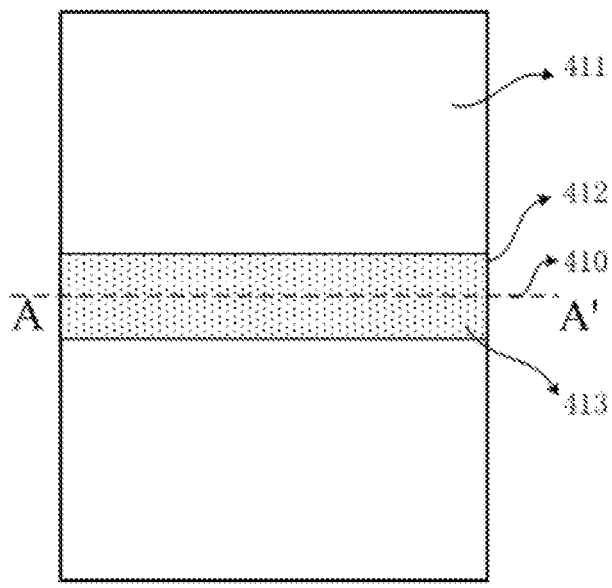
FIG. 4 is a plan view of a display device described in the present invention.
Figure 5:
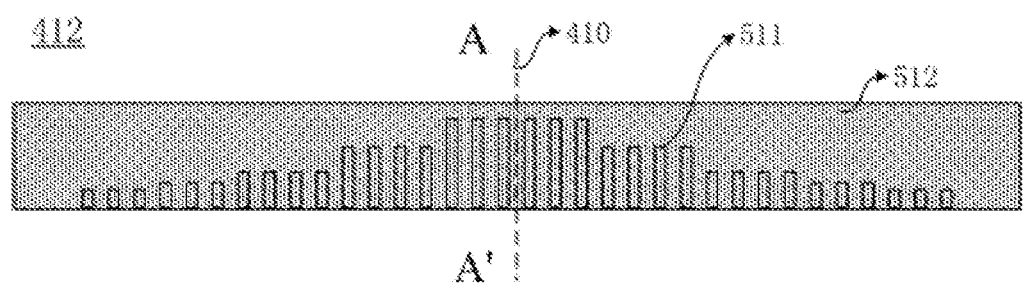
FIG. 5 is a cross-sectional view of the supporting pillar structures along a outline A-A' of FIG. 4.

Refer to FIGS. 4-5, in which FIG. 4 is a plan view of a display device in the present invention. FIG. 5 is a cross-sectional view of the supporting pillar structures along a outline A-A' in FIG. 4. The display device can be folded in half along the folding central axis 410 so that the area of the display device after folding is reduced by half and can be expanded to work like a mobile phone or a tablet. Specifically, the display device includes a display panel, wherein a touch control sensing layer 411 and a flexible cover (not shown) are disposed in sequence on the display panel; wherein the touch control sensing layer 411 has a foldable region 412 provided with supporting pillar structures 413. The supporting pillar structures 413 comprises elastic support columns 511 distributed on the foldable region 412, and an adhesive 512 filled around the elastic support columns 511. Each of the elastic support columns 511 has a height less than or equal to a filling thickness of the adhesive 512, and the height of each of the elastic support columns varies with the magnitude of the stress within the foldable region 412 when the display device is folded. The touch control sensing layer 411 adheres to the other layers of the display device through the adhesive 512 of the supporting pillar structures 413.

Preferably, the elastic support columns 511 are made of organic transparent materials such as polyacrylic acid and polyurethane.

Preferably, the elastic support columns 511 are uniformly distributed on the foldable region 412. The height of each of the elastic support columns 511 is gradually reduced from a central area of the foldable region 412 toward two sides of the foldable region 412. That is, the height of each of the elastic support columns 511 is increased accordingly within the area with high stress in the foldable region 412, so that a slightly larger deformation can occur, and the product can be quickly restored after the product is expanded, while the height of each of the elastic support columns 511 within the area with smaller stress is decreased accordingly, so that the degree of the deformation is smaller. The filling thickness and adhesion of the adhesive 512 can be controlled by adjusting the height and density of the elastic support columns 511 to ensure the best folding results of the product.

Optionally, the elastic support columns 511 are formed on the foldable region 412 by jet printing or an exposure development process.

Optionally, the adhesive 512 includes an optically clear adhesive (OCA) or an optical clear resin (OCR). The OCR is a special adhesive designed for the bonding of transparent optical components. The optical clear resin can fill the gap between the panel and the transparent protective layer and the liquid crystal module to improve the contrast of the display. Compared with the traditional method of using air gap, the optical clear resin can suppress the scattering caused by external illumination and backlight. The optical clear resin which is rapidly molded by UV irradiation has a refractive index and a light transmittance similar to a glass, and is resistant to yellowing, and can withstand the expansion and contraction rate of a variety of different substrates, so as to withstand the problems caused by high and low temperature changes during bonding.

The display device in the present invention uses elastic support columns formed on a foldable region of a touch control sensing layer, and an adhesive filled around the elastic support columns, wherein the height of each of the elastic support columns varies with the magnitude of the stress within the foldable region when the display device is folded, and a thickness of the adhesive can be controlled by adjusting the height and the density of the elastic support column, to ensure the best folding results. In this way, the product can maintain its appearance without apparent changes before and after folding during the whole procedure from the flat state to the folded state further to the expanding state due to the support function of the elastic support column and the firm adhesion of the adhesive, thereby avoiding the adhesive deformation which is not recoverable due to the much thick adhesive and a repeated folding, and realize a flexible foldable touch control display.

Furthermore, the supporting pillar structures provided by the present invention can be disposed between different layers of the display device to adhere the different layers to each other. Different embodiments are given below for detailed description in combination with the accompanying drawings.

Figure 6:
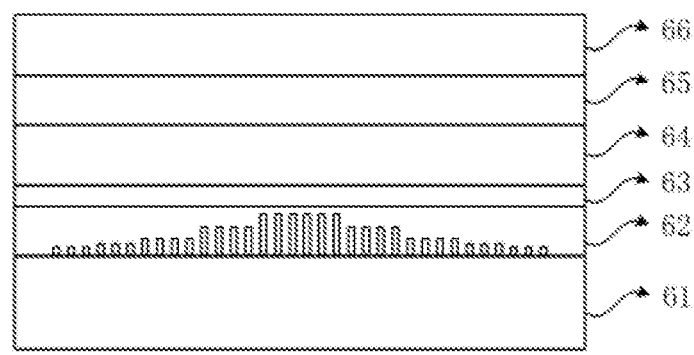
FIG. 6 is a cross-sectional view of a display device in a first embodiment of the present invention.

Refer to FIG. 6, which is a cross-sectional view of a display device in a first embodiment of the present invention. In this embodiment, the display device includes a display panel, a touch control sensing layer 64 and a flexible cover 66. The display panel is an active-matrix organic light-emitting diode (AMOLED) panel 61. The touch control sensing layer 64 is formed on an upper surface of a touch sensitive film layer 63, and the supporting pillar structures 62 are formed on an lower surface of the touch sensitive film layer 63. The lower surface of the touch sensitive film layer 63 is adhered to the AMOLED panel 61 through the supporting pillar structures 62. The upper surface of the touch control sensing layer 64 is adhered to the flexible cover 66 through the adhesive 65.

Specifically, in this embodiment, the touch control sensing layer is formed on the upper surface of the touch sensitive film layer, the elastic support columns are formed on the lower surface of the touch sensitive film layer by jet printing or an exposure development process, and an adhesive (OCA or OCR) is filled around the elastic support columns. The lower surface of the touch sensitive film layer is adhered to the AMOLED panel through the adhesive of the supporting pillar structures 62, and the upper surface of the touch control sensing layer is directly adhered to the flexible cover through the adhesive (OCA/OCR) without the elastic support columns.

That is, an out-cell touch panel (out-cell TP) in this embodiment includes a touch sensitive film layer (touch film), a touch control sensing layer (touch sensor) formed on an upper surface of the touch sensitive film layer, and the supporting pillar structures are formed on a lower surface of the touch sensitive film layer. The material of the touch sensitive film layer can be polyimide, cyclic olefin copolymer, or polyethylene terephthalate, served as a substrate and a carrier for the touch control sensing layer.

AMOLED originated from OLEO display technology. AMOLED as self-illuminating properties, with very thin coatings of organic materials and glass substrates that illuminate when current is passed through them. The AMOLED panel is self-illuminating, unlike the TFT-LCD, which requires a backlight, so that the AMOLED panel has a wide viewing angle and high color saturation, especially has low driving voltage and low power consumption, as well as fast response, light weight, thin thickness, simple structure, low cost etc., it is considered one of the most promising products.

Figure 7:
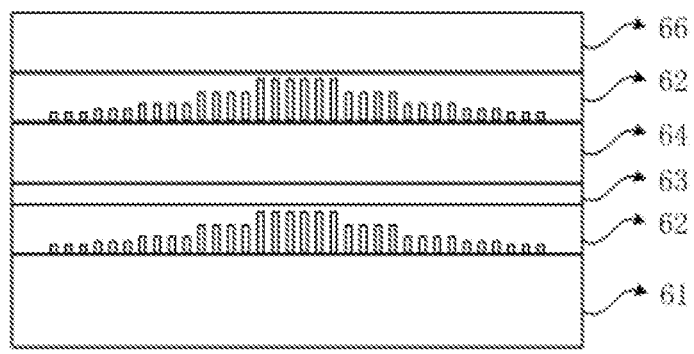
FIG. 7 is a cross-sectional view of a display device in a second embodiment of the present invention.

Refer to FIG. 7, which is a cross-sectional view of a display device in a second embodiment of the present invention. The difference between FIG. 7 and FIG. 6 is that the upper surface of the touch control sensing layer 64 in this embodiment has the supporting pillar structures 62. The lower surface of the touch sensitive film layer 63 is adhered to the AMOLED panel 61 through the supporting pillar structures 62, and the upper surface of the touch control sensing layer 64 is also adhered to the flexible cover 66 through the supporting pillar structure 62. That is, the adhesive 64 between the flexible cover 66 and the touch control sensing layer 64 is also made of the supporting pillar structure 62.

Figure 8:
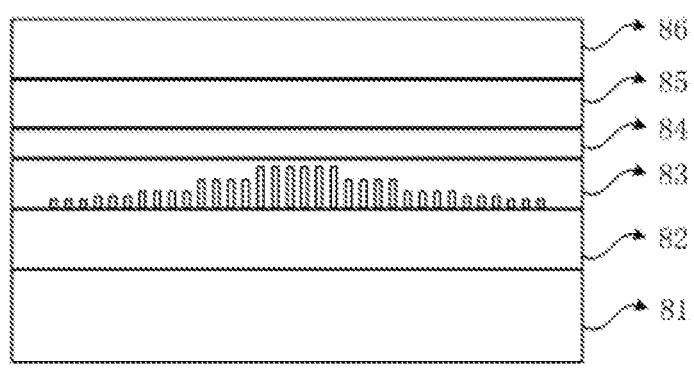
FIG. 8 is a cross-sectional view of a display device n a third embodiment of the present invention.

Refer to FIG. 8, which is a cross-sectional view of a display device in a third embodiment of the present invention. In this embodiment, the display device includes a display panel, a touch control sensing layer 82, a polarizer 84, and a flexible cover 86. The display panel is an AMOLED panel. The touch control sensing layer 82 is formed on a TFE encapsulating layer 81 of the AMOLED, supporting pillar structures 83 are formed on the touch control sensing layer 82. The ouch control sensing layer 82 is adhered to the polarizer 84 through the supporting pillar structures 83, and the polarizer 84 is adhered to the flexible cover 86 through an adhesive 85. That is, the touch control sensing layer 82 and the polarizer 84 are adhered to each other by the adhesive of the supporting pillar structures 83, and the polarizer 84 is directly adhered to the flexible cover 86 through the adhesive without elastic support columns.

Specifically, in this embodiment, the touch control sensing layer is formed on the TEE encapsulation layer of the AMOLED panel; the elastic support columns are formed on the touch control sensing layer by jet printing or an exposure development process, and an adhesive (OCA/OCR) is filled around the elastic support columns. The touch control sensing layer adheres to the polarizer through the adhesive within the supporting pillar structures. The polarizer is directly adhered to the flexible cover through the adhesive (OCA/OCR) without the elastic support columns.

Figure 9:
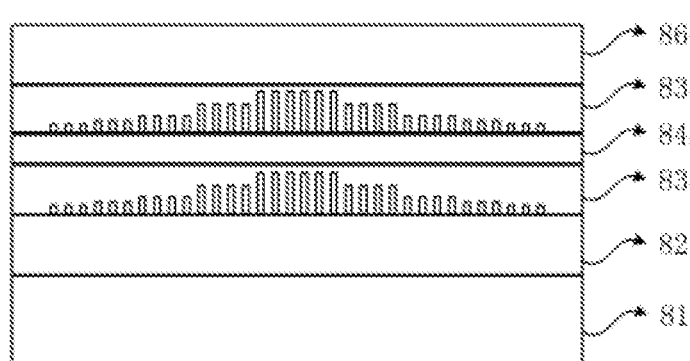
FIG. 9 is a cross-sectional view of a display device in a fourth embodiment of the present invention.

Refer to FIG. 9, a cross-sectional view of the product illustrated in the fourth embodiment of the display device according to the present invention. The difference between this embodiment and the embodiment shown in FIG. 8 is that a surface of the polarizer 84 in this embodiment used for adhering to the flexible cover is further provided with the supporting pillar structures 83, and the polarizer 84 also adheres to the flexible cover 86 through the supporting pillar structures 83. That is, the supporting pillar structures are provided between the polarizer and the flexible cover as an adhering agent to adhere them to each other.

The above descriptions are merely preferred embodiments for implementing the present application. It should be noted that those skilled in the art can make several improvements and modifications without departing from the principles of the present invention. These improvements and modifications should also be considered as the protection scope of the present invention.

What is claimed is:

1. A display device, comprising: a display panel, wherein a touch control sensing layer and a flexible cover are disposed in sequence on the display panel;
wherein the touch control sensing layer has a foldable region provided with supporting pillar structures;
the supporting pillar structures comprise elastic support columns distributed on the foldable region, and an adhesive filled around the elastic support columns;
the elastic support columns are made of an organic transparent material and uniformly distributed on the foldable region; and
each of the elastic support columns has a height less than or equal to a filling thickness of the adhesive, and the height of each of the elastic support columns is gradually reduced from a central area of the foldable region toward two sides of the foldable region;
and
wherein the display panel is an active-matrix organic light-emitting diode (AMOLED) panel, the touch control sensing layer is formed on an upper surface of a touch sensitive film layer, and the supporting pillar structures are formed on a lower surface of the touch sensitive film layer; and the lower surface of the touch sensitive film layer is adhered to the AMOLED panel through the supporting pillar structures, and the upper surface of the touch control sensing layer is adhered to the flexible cover through the adhesive.

2. The display device according to claim 1, wherein the elastic support columns are formed on the foldable region by jet printing or an exposure development process.

3. The display device according to claim 1, wherein the adhesive includes an optically clear adhesive or an optical clear resin.

4. The display device according to claim 1, wherein the upper surface of the touch control sensing layer is further formed with the supporting pillar structures thereon; and the upper surface of the touch control sensing layer adheres to the flexible cover through the supporting pillar structures.

5. A display device, comprising a display panel, wherein a touch control sensing layer and a flexible cover are disposed in sequence on the display panel;

wherein the touch control sensing layer has a foldable region provided with supporting pillar structures;

the supporting pillar structures comprises elastic support columns distributed on the foldable region, and an adhesive filled around the elastic support columns; and each of the elastic support columns has a height less than or equal to a filling thickness of the adhesive, and the height of each of the elastic support columns varies with a magnitude of a stress within the foldable region when the display device is folded;

and wherein the display device further includes a polarizer, and the display panel is an AMOLED panel, wherein the touch control sensing layer is formed on a thin film encapsulation layer of the AMOLED panel; the touch control sensing layer adheres to the polarizer through the supporting pillar structures, and the polarizer adheres to the flexible cover though the adhesive.

6. The display device according to claim 5, wherein the height of each of the elastic support columns is gradually reduced from a central area of the foldable region toward two sides of the foldable region.

7. The display device according to claim 5, wherein the elastic support columns are uniformly distributed on the foldable region.

8. The display device according to claim 5, wherein the elastic support columns are formed on the foldable region by jet printing or an exposure development process.

9. The display device according to claim 5, wherein the elastic support columns are made of an organic transparent material.

10. The display device according to claim 5, wherein the adhesive includes an optically clear adhesive or an optical clear resin.

11. The display device according to claim 5, wherein a surface of the polarizer for adhering to the flexible cover is further provided with the supporting pillar structures, and the polarizer adheres to the flexible cover through the supporting pillar structures.

* * * * *